(12) United States Patent
Guo et al.

(10) Patent No.: US 11,450,466 B2
(45) Date of Patent: Sep. 20, 2022

(54) COMPOSITE SEED STRUCTURE TO IMPROVE PMA FOR PERPENDICULAR MAGNETIC PINNING

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

(*) Notice: Subject to any disclaimer, the term of this patent is extended or adjusted under 35 U.S.C. 154(b) by 157 days.

(21) Appl. No.: 16/997,879

(22) Filed: Aug. 19, 2020

(65) Prior Publication Data

US 2022/0059270 A1 Feb. 24, 2022

(51) Int. Cl.
| | |
|---|---|
| H01L 43/02 | (2006.01) |
| H01F 10/32 | (2006.01) |
| H01L 43/12 | (2006.01) |
| H01F 41/32 | (2006.01) |
| H01L 43/10 | (2006.01) |

(52) U.S. Cl.
CPC ....... *H01F 10/3286* (2013.01); *H01F 10/329* (2013.01); *H01F 10/3254* (2013.01); *H01F 10/3272* (2013.01); *H01F 41/32* (2013.01); *H01L 43/02* (2013.01); *H01L 43/12* (2013.01); *H01L 43/10* (2013.01)

(58) Field of Classification Search
CPC ............. H01F 10/3286; H01F 10/3254; H01F 10/3272; H01F 10/329; H01F 41/32; H01L 43/02; H01L 43/12; H01L 43/10

USPC ......................................................... 257/421
See application file for complete search history.

(56) References Cited

U.S. PATENT DOCUMENTS

| | | | | |
|---|---|---|---|---|
| 9,673,385 | B1* | 6/2017 | Liu | ............... H01F 10/3236 |
| 2014/0015079 | A1* | 1/2014 | Jan | ................ H01L 43/02 257/421 |
| 2014/0217526 | A1* | 8/2014 | Guo | ................ G11C 11/02 257/421 |
| 2019/0013460 | A1* | 1/2019 | Ikegawa | ............ H01F 10/329 |
| 2020/0220071 | A1* | 7/2020 | Guo | ................ H01L 43/02 |
| 2021/0233576 | A1* | 7/2021 | Xiao | ................ H01L 43/02 |
| 2021/0249469 | A1* | 8/2021 | Xiao | ................ H01L 43/08 |
| 2021/0273157 | A1* | 9/2021 | Guo | ................ H01L 43/08 |
| 2021/0343934 | A1* | 11/2021 | Guo | ................ H01F 10/3272 |

* cited by examiner

*Primary Examiner* — Jami Valentine Miller

(57) ABSTRACT

The invention comprises a novel composite seed structure (CSS) having lattice constant matched crystalline structure with the Co layer in above perpendicular magnetic pinning layer (pMPL) so that an excellent epitaxial growth of magnetic super lattice pinning layer $[Co/(Pt, Pd \text{ or } Ni)]_n$ along its FCC (111) orientation can be achieved, resulting in a significant enhancement of perpendicular magnetic anisotropy (PMA) for perpendicular spin-transfer-torque magnetic-random-access memory (pSTT-MRAM) using perpendicular magnetoresistive elements as basic memory cells which potentially replace the conventional semiconductor memory used in electronic chips, especially mobile chips for power saving and non-volatility.

20 Claims, 3 Drawing Sheets

COMPOSITE SEED STRUCTURE TO IMPROVE PMA FOR PERPENDICULAR MAGNETIC PINNING

CROSS-REFERENCE TO RELATED APPLICATIONS

This application is a continuation-in-part of and claims the benefit of co-pending U.S. patent application Ser. No. 16/786,304, filed Feb. 10, 2020, entitled A NOVEL LATTICE MATCHED SEED LAYER TO IMPROVE PMA FOR PERPENDICULAR MAGNETIC PINNING.

BACKGROUND OF THE INVENTION

1. Field of the Invention

This invention relates to a novel composite seed structure (CSS) to improve perpendicular magnetic anisotropy (PMA) for magnetic pinning multilayer in a magnetic structure, such as a perpendicular magnetic tunnel junction (pMTJ). It can in particular be used in magnetic memory, magnetic logic, spin-torque oscillator and magnetic sensor applications.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a multilayer structure formed by stacking a free layer (FL) having a variable magnetization direction, a reference layer (RL) having an invariable magnetization, a nonmagnetic spacing layer between the FL and the RL, and a pinning layer (PL) that contacts the RL and located on the opposite side from the tunnel barrier layer and having a predetermined magnetization direction through a strong magnetic anisotropy and pins the magnetization in the RL through an anti-ferromagnetic coupling (AFC) via RKKY interactions typically introduced by a thin Ru (or Rh, Cr, etc.) layer having a certain thickness range. The nonmagnetic spacing layer sandwiched between the FL and the RL is normally made of an oxide and serves as a tunneling barrier (TB) in a magnetic tunnel junction. In a spin-orbit torque (SOT) MRAM, there is an additional SOT layer immediately located on an opposite side of the FL with respect to the nonmagnetic spacing layer. The SOT layer can be a thin layer made of heavy transition metal layer such as W or Ta, Pt, etc., or a layer of topological insulating layer such as BiSB. The magnetization of the FL can be switched to parallel or anti-parallel alignment with that of the RL. The magnetic state of an MRAM cell is read out by using the tunnel magneto-resistance (TMR) of the MTJ. Parallel magnetic configuration usually yields a lower resistance than the anti-parallel configuration.

As a write method to be used in such magnetoresistive elements of a spin-torque transfer (STT) MRAM, there has been suggested a write method (spin-torque transfer switching technique) using spin momentum transfers. According to this method, the magnetization direction of a free layer (FL) is reversed by applying a spin-polarized current to the magnetoresistive element. Furthermore, as the volume of the magnetic layer forming the FL is smaller, the injected spin-polarized current to write or switch can be also smaller. Accordingly, this method is expected to be a write method that can achieve both device miniaturization and lower currents. In a SOT MRAM, an electric current flows in the SOT layer, which is also a paramagnetic layer, to generate a spin-polarized current and inject it into its adjacent FL, which is a ferromagnetic layer. The spin-polarized current then exerts a torque on the magnetic moment of the FL to reverse its direction.

Further, as in a so-called perpendicular pMTJ element, both three magnetization films, i.e., the free layer (FL), the reference layer (RL) and the pinning layer (PL), have easy axis of magnetization in a direction perpendicular to the film plane due to their strong perpendicular interfacial anisotropy and magnetic crystalline anisotropy (shape anisotropies are not used), and accordingly, the device shape can be made smaller than that of an in-plane MTJ element. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high TMR (tunnel magneto-resistance) ratio in a perpendicular MTJ element by forming an underneath MgO tunnel barrier layer and a BCC or HCP-phase cap layer that sandwich a thin free layer (FL) having an amorphous CoFeB ferromagnetic film and accelerate crystallization of the amorphous ferromagnetic film to match interfacial grain structure to the MgO layer through a thermal annealing process. The FL crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunnel junction structure is formed. By using this technique, a high MR ratio can be achieved.

A conventional core structure of the pMTJ stack 100 comprises (see FIG. 1) a fixed perpendicular magnetic pinning element (70), a tunnel barrier (17) and a free layer (90). The fixed perpendicular magnetic pinning element (pMPE) is typically formed by a synthetic anti-ferromagnetic (SAF) stack: $[Co/X]_m/Co/Ru/Co/[X/Co]_n$/crystal-structure-breaking-layer/magnetic-reference-layer, where X represents Pt, Pd or Ni metal element, m and n are integers (normally m>n), and Ru is used as an AFC (anti-ferromagnetic-coupling) spacer to provide an anti-parallel RKKY coupling between $[Co/X]_m/Co$ and $Co/[X/Co]_n$. Here and thereafter throughout this application, each element written in the left side of "/" is stacked below an element written in the right side thereof. As shown in FIG. 1, the conventional synthetic anti-ferromagnetic (SAF) stack (70) sequentially comprises a perpendicular magnetic pinning layer (pMPL) $[Co/Pt]_m/Co$ (12), a Ru AFC spacer (13), an upper magnetic multilayer (14) such as $Co/[Pt/Co]_n$, a crystal-structure-breaking-layer (15) such as W, Mo or Ta, a magnetic-reference-layer (16) such as CoFeB. A typical bottom-pinned pMTJ full film stack (100) is shown in FIG. 1 which starts on a substrate (not shown here), a seed layer (11) such as Pt, a perpendicular synthetic anti-ferromagnetic (SAF) multilayer stack (70), an MgO tunnel barrier (17), a tri-layer free layer (90) consisting of a first magnetic material layer (18) such as CoFeB, a non-magnetic B absorption layer (19) such as W, Mo or Ta and a second magnetic material layer (20) such as CoFeB, a capping layer (21) such as MgO, W or W/Ru. This pMTJ comprises a thick pMPE film stack having a large magnetic moment which makes both device design and patterning process difficult for high density memory applications.

Recently a French research group proposed (see *Scientific Reports* 8, *Article number:* 11724, 2018 and US patent application 2019/0051822) another pMTJ stack 200 with a thin synthetic anti-ferromagnetic (tSAF) structure (80) on a Pt seed-layer (11) and comprising a pinning layer [Co/Pt]$_m$/Co (12), a Ru/W bi-layer AFC spacer (15) and a magnetic reference layer CoFeB (16) as shown in FIG. 2. Although the authors claimed multi-functionalities of their bi-layer Ru/W AFC spacer (15): (i) absorbing boron out of the magnetic layer (CoFeB) in contact with W layer upon annealing, (ii) allowing the crystalline transition between the FCC part of the stack [Co/Pt]$_m$/Co of 3-fold symmetry and the BCC part of the stack CoFeB next to the MgO barrier (of 4-fold symmetry) and (iii) preventing inter-diffusion between the two parts of the SAF during high temperature annealing. Note that the RKKY coupling at Co/Ru/W/CoFeB interface is not as strong as at the Co/Ru/Co interface in the case of SAF.

No matter whether it is a thick conventional SAF or a thin tSAF film stack, a key factor to achieve stable magnetic pinning is perpendicular magnetic anisotropy (PMA) of the perpendicular magnetic pinning layer (pMPL) [Co/Pt]$_m$/Co (12), which provides a magnetic anchoring force to prevent the entire SAF (or tSAF) film stack from a concurrent rotation under the influence of spin transfer torque or an external magnetic field. It was reported (see Article: *Appl. Phys. Lett.* 96, 152505 (2010)) that the PMA of Co/Pt (or Co/Pd) magnetic multilayer is closely dependent on the lattice constant of the multilayer itself, and a positive (perpendicular) PMA occurs only when Co/Pt (or Co/Pd) multilayer has FCC crystalline structure with a lattice constant larger than ~0.372 nm, and the larger the lattice constant, the higher is the PMA of Co/Pt (or Co/Pd) multi-layer. Without an external factor, increase of the PMA of Co/Pt (or Co/Pd) can only be achieved by increasing the thickness of Pt (or Pd) spacer. However, a research group found (see their report: *Sensors*, 17(12): 2743, December 2017) that the effective energy per bi-layer starts to decrease linearly after a lattice constant value of ~0.383 nm. They attributed this to the enhanced increase in the Pd fraction compared to the Co, which weakens the ferromagnetic coupling between the adjacent ultrathin Co layers.

SUMMARY OF THE PRESENT INVENTION

The present invention discloses a composite seed structure (CSS) having face-center-cubic (FCC) crystalline structure with large grain sizes to promote a perfect FCC (111) growth for a perpendicular magnetic pinning layer (pMPL), which is directly deposited on top of the CSS, to enhance its PMA needed for magnetic stabilization. The microstructure of the CSS is highly dependent on the characteristics of its underlying base-layer. A smooth and strongly textured base-layer is needed to promote the development of highly textured CSS with large grains and also serves as a diffusion barrier for the CSS. For this purpose, the base-layer is made of a metal layer, metal oxide layer or metal nitride layer comprising at least one element selected from the group consisting of Ta, Hf, Nb, Mo, W, Zr, Ti, V, Cr, Ru, Rh, Zn. The CSS comprises at least a modulating-layer (ML) having a face-center-cubic (FCC) crystalline structure, a buffer-layer (BL) and a top-seed-layer (TL) stacked in a form of ML/BL/TL, wherein the ML is made of a metal or metal nitride layer selected from Cu, CuN, CuCo, CuNi, NiN, the BL comprises at least one of the following elements Ni, Fe, Co, B, Cr, Ta, Hf, Nb, Zr, Mo, W, Ru or an alloy thereof or a multilayer of alloys thereof, the TL comprises a metal layer selected from the group consisting of Pt, Pd, Ir, and having a thickness between 1 nm and 3 nm. The BL can be a single element metal layer, a metal alloy layer or a metal alloy multilayer comprising multiple sub-layers of metal alloys. Both of the CSS and the pMPL have FCC crystalline structures together for a high perpendicular anisotropy (PMA).

The present invention further discloses an alloy AFC spacer (AAS). The AAS is a metal alloy comprising at least one of the following elements Ru, Rh, Cr, Ir or an alloy thereof and at least one of the following elements Mo, W, Nb, Cr or an alloy thereof. Since a perpendicular magnetic reference layer (pMRL) is a body-center-cubic (BCC) crystalline structure for a high TMR ratio, the alloy AFC spacer (AAS) serves for a good crystalline transition and a strong anti-ferromagnetic coupling between the CSS/pMPL and pMRL. A sequential deposition of above four layers constitutes a strong perpendicular magnetic pinning element (pMPE): CSS/pMPL/AAS/pMRL with an enhanced PMA, an anti-ferromagnetic coupling (AFC) as well as a desired crystalline structure arrangement for a high TMR ratio.

The pMPL comprises a multilayered stack containing [Co/(Pt, Pd or Ni)]$_n$/Co or [Co/(Pt, Pd or Ni)]$_n$/Co/CoFe, and the AAS comprises a single metal alloy layer of RuMo, RhMo, RuW, RhW, or CrMo, wherein the composition of Mo or W is between 5% and 25%. And the pMRL comprises a single layer CoFeB, or a bi-layer stack of Fe/CoFeB, Fe/FeB, FeB/CoFe, or a multilayered stack Co/[(Pt, Pd or Ni)]$_m$/Co/(W, Mo or Ta)/CoFeB.

The above pMPE with a large PMA is employed to form a perpendicular magneto-resistive element comprising pMPE(or CSS/pMPL/AAS/pMRL)/TB/FL/CL, wherein said TB is a tunnel barrier, FL is a free layer (FL) having magnetic anisotropy in a direction perpendicular to a film surface and having a variable magnetization direction atop the tunnel barrier layer and CL is a capping layer.

The perpendicular magneto-resistive element is further sandwiched between an upper electrode and a lower electrode to form a magnetic memory element in an MRAM memory cell, which also comprises a write circuit which bi-directionally supplies a spin polarized current to the magnetic memory element and a select transistor electrically connected between the magnetic memory element and the write circuit.

DETAILED DESCRIPTION OF THE INVENTION

Figure 1:
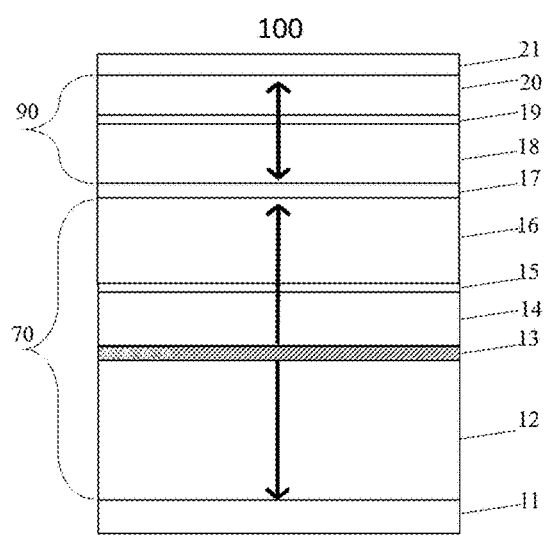
FIG. 1 A conventional pSTT-MRAM film stack with a conventional synthetic anti-ferromagnetic (SAF) pinning layer.
Figure 2:
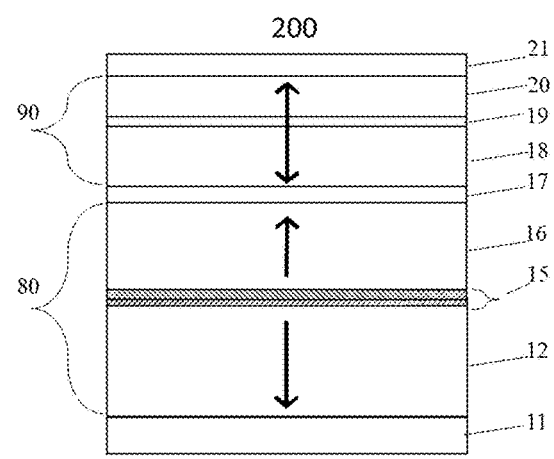
FIG. 2 A pSTT-MRAM film stack with a thin synthetic anti-ferromagnetic (tSAF) pinning layer.
Figure 3A:
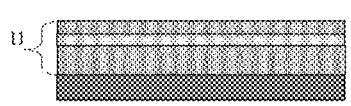
FIG. 3A Building stack of a composite seed structure (CSS).

The perpendicular magnetic anisotropy (PMA) of a perpendicular magnetic pinning layer (pMPL) consisting of a [Co/(Pt, Pd or Ni)]$_n$/Co multilayer is closely related to its lattice structure. In this invention, we disclose a composite seed structure (CSS) having a FCC crystalline structure with (111) orientation plane normal to a film surface, i.e., FCC (111) texture, which is underneath of a [Co/(Pt, Pd or Ni)]$_n$/Co pMPL multilayer to provide a specially engineered lattice mold (bedding) for the growth of closed packed Co and (Pt, Pd or Ni) atoms, i.e., FCC (111) texture, in the [Co/(Pt, Pd or Ni)]$_n$/Co pMPL multilayer to maximize its PMA. An underlying base-layer for the CSS is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1 nm and 20 nm. The CSS comprises a modulating-layer (ML) having a face-center-cubic (FCC) lattice constant between 0.34 nm and 0.37 nm, a buffer-layer (BL) and a top-seed-layer (TL), sequentially from bottom to top. Among the various materials in periodical table, there are some metallic elements (see Table 1) which naturally form an FCC crystalline structure in their solid phase with lattice constant close to the closed packed (either FCC or HCP) Co, which is the key element that forms [Co/(Pt, Pd or Ni)]$_n$/Co multilayer, which sometimes is referred as a super-lattice due to its periodic structure in atomic level. The first Co layer in the pMPL is directly deposited on the TL layer of CSS, which has a perfect FCC (111) orientation normal to the film surface. Note that the face-center-cubic (FCC) lattice constant of the modulating-layer (ML) is chosen between 0.34 nm and 0.37 nm in order to match the lattice constant (0.355 nm) of FCC Co. There are several embodiments or film configurations for the CSS listed as below:

(1) a tri-layer stacked structure ML/BL/TL, wherein the ML is made of a metal or metal nitride layer selected from Cu, CuN, CuCo, CuNi and NiN, having a thickness between 3 nm and 20 nm; the BL comprises at least one of the following elements Ni, Fe, Co, B, Cr, Ta, Hf, Nb, Zr, Mo, W, Ru or an alloy thereof or a multilayer of alloys thereof; and the TL comprises a metal layer selected from the group consisting of Pt, Pd, Ir, and having a thickness between 1 nm and 3 nm. FIG. 3A shows the CSS with a tri-layer stack structure ML/BL/TL.

(2) a tri-layer stacked structure ML/BL/TL, wherein the ML is made of a metal or metal nitride layer selected from Cu, CuN, CuCo, CuNi and NiN, having a thickness between 3 nm and 20 nm; the BL comprises a Cr-containing alloy layer having at least one element selected from the group consisting of Ni, Fe, Co, B, Ta, Hf, Nb, Zr, Mo, W, Ru and having a thickness between 1 nm and 10 nm; and the TL comprises a metal layer selected from the group consisting of Pt, Pd, Ir, and having a thickness between 1 nm and 3 nm. FIG. 3A shows the CSS with a tri-layer stack structure ML/BL/TL.

(3) a tri-layer stacked structure ML/BL/TL, wherein the ML is made of a metal or metal nitride layer selected from Cu, CuN, CuCo, CuNi and NiN, having a thickness between 3 nm and 20 nm; the BL comprises a multilayered stack consisting of a Cr-containing alloy layer having at least one element selected from the group consisting of Ni, Fe, Co, B, Ta, Hf, Nb, Zr, Mo, W, Ru, and at least one buffer enhancement layer (BEL) having at least one of the following elements Ni, Fe, Co, B, Cr, Ta, Hf, Nb, Zr, Mo, W, Ru or an alloy thereof; and the TL comprises a metal layer selected from the group consisting of Pt, Pd, Ir, and having a thickness between 1 nm and 3 nm. FIG. 3A shows the CSS with a tri-layer stack structure ML/BL/TL.

Figure 3B:
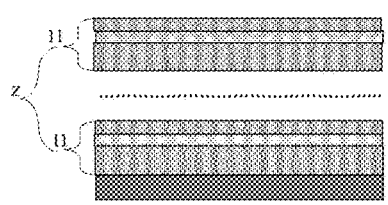
FIG. 3B Repeated multi-stack of CSS with one repetition number z.

(4) a multi-layered stack structure (ML/BL/TL)$_z$, wherein said z is an integer between 2 and 5 inclusive, and each ML is made of a metal or metal nitride layer selected from Cu, CuN, CuCo, CuNi and NiN, having a thickness between 3 nm and 20 nm; each BL is made of a metal layer having at least one of the following elements Ni, Fe, Co, B, Cr, Ta, Hf, Nb, Zr, Mo, W or an alloy thereof or a multilayer of alloys thereof; and each TL comprises a metal layer selected from the group consisting of Pt, Pd, Ir, and having a thickness between 1 nm and 3 nm. FIG. 3B shows said CSS with multiple repetition z.

Figure 3C:
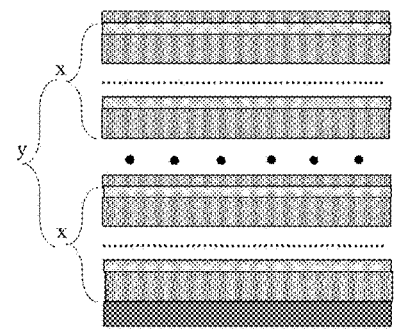
FIG. 3C Repeated multi-stack of CSS with two repetition numbers x and y.

(5) a multi-layered stack structure [(ML/BL)$_x$/TL]$_y$, wherein said x, y are integers between 2 and 5 inclusive, and each ML is made of a metal or metal nitride layer selected from Cu, CuN, CuCo, CuNi and NiN, having a thickness between 3 nm and 20 nm; each BL is made of a metal layer having at least one of the following elements Ni, Fe, Co, B, Cr, Ta, Hf, Nb, Zr, Mo, W or an alloy thereof or a multilayer of alloys thereof; and each TL comprises a metal layer selected from the group consisting of Pt, Pd, Ir, and having a thickness between 1 nm and 3 nm. FIG. 3C shows said CSS with multiple repetition x and y.

(6) said CuN or NiN in above CSS may be replaced by metal nitrides TiN, RhN, AlN or AgN. By adjusting nitrogen content, the formed materials can also provide a good lattice match with the Co layer in said [Co/Pt or Pd] multilayer.

The following lists are some typical embodiments of full pSTT-MTJ films to illustrate the use of said CSS to improve PMA for perpendicular magnetic stabilization for bottom-pined and dual-pinned pSTT-MRAM having either a thick SAF or thin tSAF film stack:

First Embodiment of a Full pSTT-MTJ Film

Figure 4:
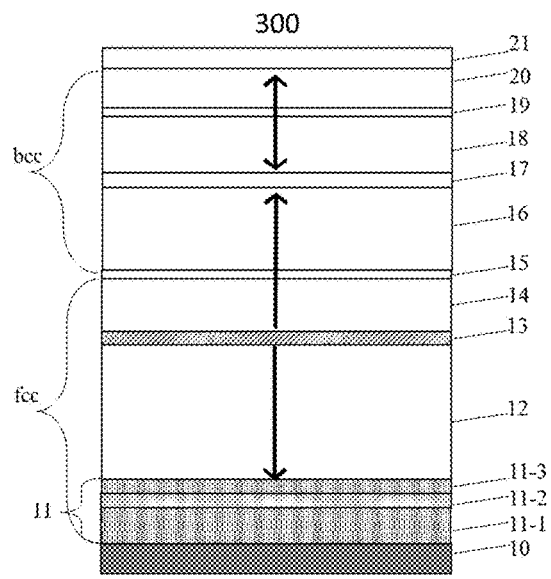
FIG. 4 A bottom-pinned pSTT-MRAM with a thick SAF film stack having a CSS.

FIG. 4 is a bottom-pinned pSTT-MTJ film (300) with a thick SAF stack. Its layer-by-layer structure sequentially from bottom to top is as follows: a base-layer (10) was first grown on a device substrate (not shown here); followed by a composite seed structure (CSS) (11) comprising ML(11-1)/BL(11-2)/TL(11-3); followed by a thick SAF stack (12/13/14) of [Co/Pt or Pd]$_n$Co/Ru/Co/[(Pt or Pd)/Co]$_m$ in which the thickness of Co is between 0.3 nm and 0.7 nm, the thickness of Pt (or Pd) is between 0.2 nm and 0.8 nm, and the repetition numbers (m>n) are between 2 and 6 for n and between 1 and 4 for m; followed by a crystalline structure transition layer (15) of Ta, W, or Mo with a thickness between 0.1 nm and 0.5 nm; and a magnetic reference layer (16) of CoFeB with a thickness between 0.9 nm and 1.3 nm; a tunnel barrier (17) of MgO between 0.8 nm and 1.2 nm, a magnetic free layer; and a capping stack (21) of MgO(1.0-

1.5 nm)/W(1-3 nm)/R (2-5 nm). The magnetic free layer comprises a first magnetic material layer CoFeB (18) with a thickness between 1.0 nm and 1.5 nm, a magnetic Boron absorption layer (19) of CoFeTa, CoFeW, or CoFeMo with a thickness between 0.15 nm and 0.5 nm and a second magnetic material layer CoFeB (20) with a thickness between 0.5 nm and 1.0 nm. The above MTJ film stack is thermally annealed at a temperature between 350 and 450 degrees Celsius for 30 min-150 min. With the help of the CSS after the annealing, the bottom portion of the stack (11-14) will be converted into FCC crystalline structure with (111) orientation normal to the substrate surface and the upper portion of the stack (16-21) into a BCC (100) crystalline structure to achieve a large PMA while maintaining high tunnel magneto-resistance (TMR) value. During the annealing, the layer (15) of Ta, W or Mo helped the crystalline transition from the bottom FCC crystalline structure to the top BCC crystalline structure.

Second Embodiment of a Full pSTT-MTJ Film

Figure 5:
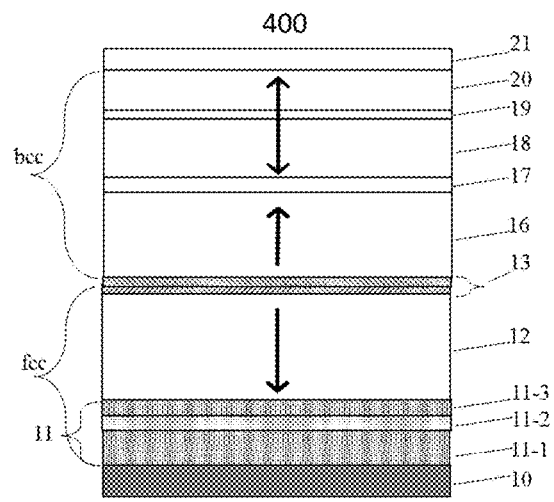
FIG. 5 A bottom-pinned pSTT-MRAM with a thin tSAF film stack having a CSS.

FIG. 5 is a bottom-pinned pSTT-MTJ film (400) with a thin tSAF stack. Its layer-by-layer structure sequentially from bottom to top is: a base-layer (10) was first grown on a device substrate (not shown here); followed by a composite seed structure (CSS) (11) comprising ML(11-1)/BL(11-2)/TL(11-3); followed by a magnetic super-lattice multilayer (12) of $[Co/X]_n/Co$ (n is an integer between 2 and 6) in which each Co layer has a thickness between 0.25 and 0.6 nm and each of X is one of Pt, Pd or Ni and has a thickness between 0.2 and 0.4 nm; an alloy AFC layer (13) of RuMo, RhMo, RuW, RhW or CrMo; a reference layer of FeB, FeB/CoFeB or CoFeB; a tunnel barrier MgO (17); a tri-layer recording layer having a first magnetic material layer (18), a non-magnetic Boron absorbing layer (19) of Mo, W or Ta, and a second magnetic material layer (20); a capping layer (21) of MgO/W, MgOFe/W, MgO/Fe/W, MgZnO/W or MgO/W/Ru. In the above stack, the thickness of RuMo, RhMo RuW, RhW or CrMo is chosen to reach the first or the second peak for an effective RKKY anti-ferromagnetic coupling (AFC) and the composition of Mo or W is between 5% and 25%, the FeB or CoFeB reference layer (16) has a Boron composition between 15% and 35% with a thickness between 0.8 nm and 1.4 nm, the thickness of MgO TB (17) is between 0.8 nm and 1.2 nm, the first magnetic material layer (18) is selected among CoFeB, FeB and Fe/CoFeB with a Boron composition between 15% and 30% and has a thickness between 1 nm and 1.6 nm, the non-magnetic Boron absorbing layer (19) of W, Mo or Ta has a thickness between 0.1 nm and 0.6 nm, the second magnetic memory layer (20) is selected among CoFeB and CoB with a Boron composition between 15 and 30% and has a thickness between 0.4 nm and 0.8 nm, the capping layer is one of (MgO, MgFeO or MgZnO)(0.7-1.5 nm)/W(2-5 nm), MgO (0.7-1.5 nm)/Fe(0.15-0.5 nm)/W(2-5 nm) or MgO(0.7-1.5 nm)/W(1-5 nm)/Ru(2-10 nm). The use of Fe in the reference layer at the CrMo interface not only increases the RKKY coupling hence improving magnetic stability for the device, but also creates a good BCC structure in the reference layer. Such a bottom-pinned pSTT-MTJ film stack will have a strong magnetic pinning with sharp layer interfaces and higher and more stable TMR characteristics, which is desired for pSTT-MRAM device application.

Figure 6:
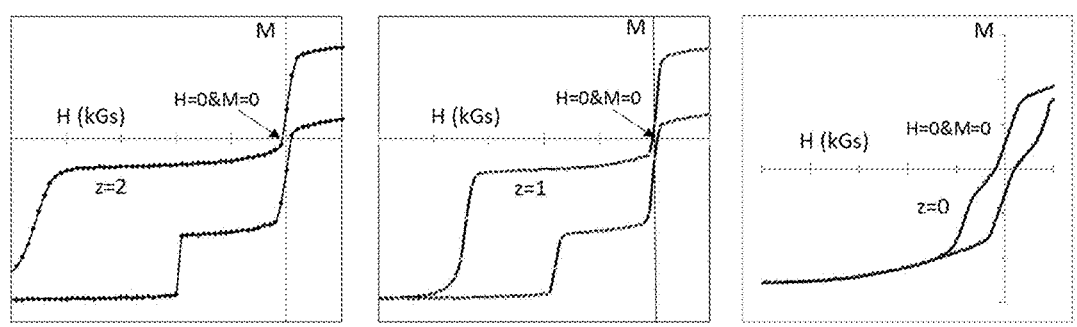
FIG. 6 Experimental test results of magnetization for three pSTT-MRAM film stacks having different CSS configurations with CSS repetition z=0, 1 and 2.

The annealing temperature of above bottom-pinned film pSTT-MRAM stacks are between 350 and 450 degrees Celsius for between 30 min to 150 min. With the help of said CSS, the low portion (11-13) of the stack will be converted into FCC crystalline structure with (111) orientation normal to film surface and the upper portion of the stack (16-21) above the alloy AFC layer (13) into a BCC (100) crystalline structure to achieve a large PMA while having a high tunnel magneto-resistive (TMR) value. A bi-layer AFC layer of Ru/W works as good as the alloy AFC layer. For comparison, FIG. 6 shows three VSM test results for three pMTJ samples with an exact film structure for all layers 12-21 except CSS is z=0 (plot-1) with no CSS), z=1 (plot-2) with CSS containing Cu(10 nm)/Ta(0.5 nm)/Pt(1.5 nm), and z=2 (plot-3) with CSS containing [Cu(10 nm)/Ta(0.5 nm)/Pt(1.5 nm)]2. It can be clearly seen that without said CSS (z=0), the perpendicular exchange coupling field pHex) is zero (plot-1). With increasing z to 1 (plot-2) and 2 (plot-3), the pHex progressively increases, indicating a stronger perpendicular magnetic pinning capability in against external magnetic field or thermal disturbance.

Third Embodiment of a Full pSTT-MTJ Film

Figure 7:
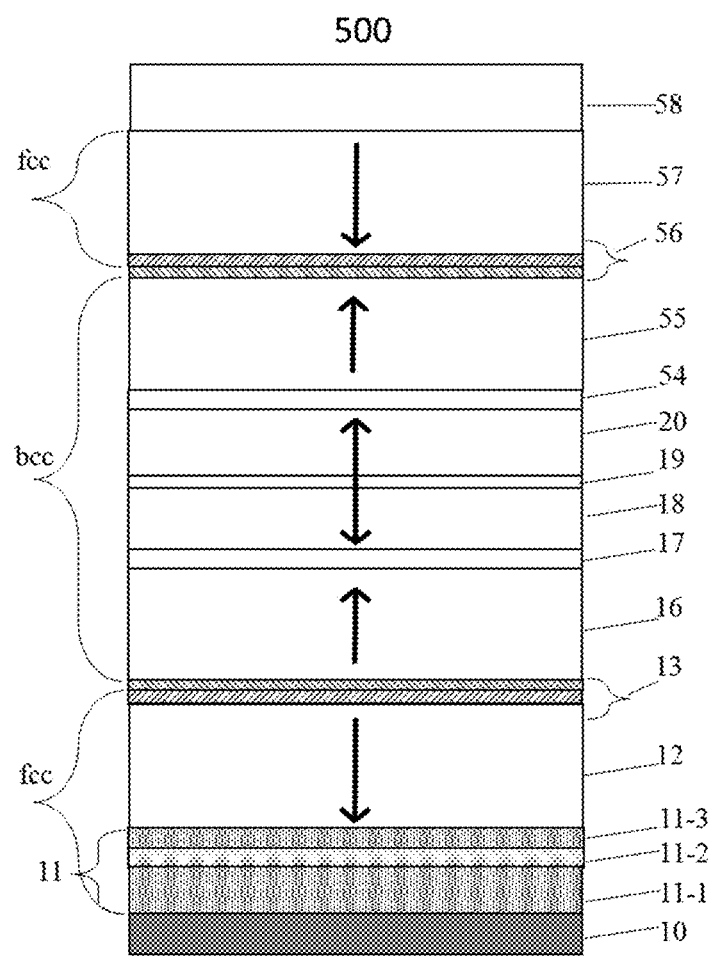
FIG. 7 A dual-pinned pSTT-MRAM with a thin tSAF film stack having a CSS.

FIG. 7 is a dual-pinned pSTT-MRAM (500) with a thin tSAF and a CSS at bottom. A typical structure of stack 500 including base-layer (10)/CSS(11)/[Co/(Pt, Pd or Ni)]$_n$/Co (12)/(Ru/Cr)(13)/Fe/CoFeB (16)/MgO(17)/CoFeB (18)/(W or Mo)(19)/CoFeB (20)/MgO(54)/CoFeB/(55)/Fe/(Cr/(Ru) (56)/Co/[(Pt, Pd or Ni)/Co]$_n$(57)/cap layer (58). During high temperature annealing, said CSS (11) will force the two multi-layers [Co/(Pt, Pd or Ni)]$_n$ in contact with from the bottom (12,13) layers and top (56,57) layer to transform into FCC crystalline structure with (111) orientation aligned normal to the film surface and all the middle (16,17,18,19, 20,54,55) layers to transform into BCC crystalline structure with (100) orientation, which not only allows to further increase the perpendicular anisotropy (PMA) to the free layer (FL) and thus increase the thermal stability and prolong the retention time of MRAM device, but also allows to increase the thickness of the FL (from 1.8 nm for bottom-pinned pSTT-MRAM stack to 4 nm) which further increases TMR value.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 1

| Atomic No | Element | X-Structure | Lattice const [A] |
|---|---|---|---|
| 28 | Ni | FCC | 3.52 |
| 29 | Cu | FCC | 3.61 |
| 45 | Rh | FCC | 3.8 |
| 46 | Pd | FCC | 3.89 |
| 77 | Ir | FCC | 3.84 |
| 78 | Pt | FCC | 3.92 |
| 26 | Fe | BCC | 2.87 |
| 49 | Mo | BCC | 3.15 |
| 73 | Ta | BCC | 3.31 |
| 74 | W | BCC | 3.16 |
| 72 | Ti | HCP | 2.95/4.68 |
| 27 | Co | HCP | 2.51/4.07 |
|  |  | FCC | 3.55 |
| 44 | Ru | HCP | 2.70/4.28 |

The invention claimed is:

1. A perpendicular magnetic pinning element (pMPE) comprising:
   a base-layer provided on the surface of a substrate;
   a composite seed structure (CSS) provided on the surface of the base-layer and having at least a modulating-layer (ML), a top-seed-layer(TL) and a buffer-layer (BL) sandwiched by the ML and the TL;
   a perpendicular magnetic pinning layer (pMPL) provided on the surface of the CSS and having a face-center-cubic (FCC) crystalline structure and having a first perpendicular magnetic anisotropy and having an invariable magnetization perpendicular to the surface of the pMPL;
   an anti-ferromagnetic coupling spacer (AFCS) provided on the surface of the pMPL;
   a perpendicular magnetic reference layer (pMRL) provided on the surface of the AFCS and having a second perpendicular magnetic anisotropy and having an invariable magnetization perpendicular to the surface of the pMRL;
   wherein,
   said ML comprises a metal layer or a metal nitride layer and having a face-center-cubic (FCC) crystalline structure and an FCC crystalline lattice constant between 0.34 nm and 0.37 nm, preferred to be selected from Cu, CuN, CuCo, CuNi and NiN;
   said BL comprises at least one of the following elements Ni, Fe, Co, B, Cr, Ta, Hf, Nb, Zr, Mo, W or an alloy thereof or a multilayer of alloys thereof;
   said TL comprises a metal layer selected from the group consisting of Pt, Pd, Ir, and having a thickness between 1 nm and 3 nm;
   said pMPL and said pMRL have an anti-ferromagnetic coupling (AFC) via an RKKY coupling through said AFCS.

2. The element of claim 1, wherein said base-layer is made of a metal layer, metal oxide layer or metal nitride layer comprising at least one element selected from the group consisting of Ta, Hf, Nb, Mo, W, Zr, Ti, V, Cr, Ru, Rh, Zn and having a thickness between 1 nm and 20 nm, preferred to be a Ta layer having a thickness between 2 nm and 6 nm.

3. The element of claim 1, wherein said ML is a Cu layer having a thickness between 3 nm and 20 nm.

4. The element of claim 1, wherein said BL is a metal layer selected from the group consisting of Ta, Hf, Nb, Zr, Mo, W, Ru, and having a thickness between 0.3 nm and 1.5 nm, preferred to be a Ta layer having a thickness between 0.3 nm and 1.0 nm.

5. The element of claim 1, wherein said BL is an alloy layer having Cr element and at least one element selected from the group consisting of Ni, Fe, Co, B, Ta, Hf, Nb, Zr, Mo, W, Ru, and having a thickness between 1 nm and 10 nm, preferred to be a NiCr or NiFeCr layer having a thickness between 1.5 nm and 5 nm.

6. The element of claim 1, wherein said BL is a multilayer consisting of a Cr-containing alloy layer having at least one element selected from the group consisting of Ni, Fe, Co, B, Ta, Hf, Nb, Zr, Mo, W, Ru and at least one buffer enhancement layer (BEL) having at least one of the following elements Ni, Fe, Co, B, Cr, Ta, Hf, Nb, Zr, Mo, W, Ru or an alloy thereof.

7. The element of claim 1, wherein said CSS is a ML/BL/TL tri-layer having a face-center-cubic (FCC) crystalline structure with a (111) texture.

8. The element of claim 1, wherein said CSS is a multi-layered stack (ML/BL/TL)$_y$ or (ML/BL)$_y$/TL, wherein said y is an integer between 2 and 5 inclusive.

9. The element of claim 1, wherein said CSS is a multi-layered stack [(ML/BL)$_x$/TL]$_y$, wherein said x, y are integers between 2 and 5 inclusive.

10. The element of claim 1, wherein said pMPL is a multilayered stack structure [Co/(Pt, Pd or Ni)$_n$/Co, wherein n is an integer between 2 and 6 inclusive, and thicknesses of each said Co sub-layer and (Pt, Pd or Ni) sub-layer are between 0.25 nm and 0.7 nm and between 0.2 nm and 0.8 nm, respectively.

11. The element of claim 1, wherein said AFCS is a single layer of (Ru, Rh or Ir) or a bi-layer of (Ru, Rh or Ir)/(Cr, Mo, W or V).

12. The element of claim 1, wherein said AFCS is a metal alloy layer comprising at least one of the following elements Ru, Rh, Cr, Ir or an alloy thereof and at least one of the following elements Mo, W, Nb, Cr or an alloy thereof, preferred to be RuMo, RhMo, RuW, RhW, or CrMo, wherein the composition of Mo or W is between 5% and 25%.

13. The element of claim 1, wherein said pMRL is a multilayered stack [Co/(Pt, Pd or Ni)]$_m$/(Co or Ta/Co)/(W or Mo)/CoFeB or Fe/[Co/(Pt, Pd or Ni)]$_m$/(Co or Ta/Co)/(W or Mo)/CoFeB, wherein m is an integer between 2 and 4 inclusive, and the Co layer has a thickness between 0.25 nm and 0.7 nm, the (Pt, Pd or Ni) layer has a thickness between 0.2 nm and 0.8 nm, the CoFeB layer has a thickness between 0.7 nm and 1.5 nm., the (W or Mo) layer has a thickness between 0.1 nm and 0.5 nm, the Ta layer has a thickness between 0.05 nm and 0.2 nm.

14. The element of claim 1, wherein said pMRL is a bi-layer stack selected from the group consisting of Fe/CoFeB, Fe/FeB, FeB/CoFeB, Fe/CoFe, wherein said Fe layer has a thickness between 0.1 nm and 0.5 nm, said CoFeB, FeB and CoFe layer have thicknesses between 0.6 nm and 1.3 nm.

15. The element of claim 1, wherein said pMRL is a CoFeB layer having a thickness between 0.7 nm and 1.3 nm.

16. A magnetic memory comprising: the perpendicular magnetic pinning element (pMPE) according to the claim 1, a tunnel barrier (TB) provided on the surface of the pMPE, a free layer (FL) provided on the surface of the TB, and a cap layer (CL) provided on the surface of the FL, wherein the FL has a perpendicular anisotropy and a variable magnetization direction.

17. The element of claim 16, wherein said TB and said CL are metal oxide layers selected from the group consisting of MgO, MgAlO, MgZnO, and having thicknesses between 0.8 nm and 1.5 nm.

18. The element of claim 16, wherein said FL comprises a stack formed by at least a first ferromagnetic material layer, a Boron absorbing layer and a second ferromagnetic material layer, wherein the first and second ferromagnetic material layers comprise at least one of the following alloys CoFeB, FeB, CoB, and the Boron absorbing layer comprises at least one of the following elements Ta, W, Mo, Nb or an alloy thereof.

19. The element of claim 16, further comprising a bottom electrode underneath said CSS layer and a top electrode atop said cap layer.

20. A method of forming a magnetic memory comprising:
   forming a bottom electrode (BE);
   forming a base-layer on the surface of said BE;
   forming a composite seed structure (CSS) on the surface of said base-layer and having at least one sandwich structure: a modulating-layer/a buffer-layer/a top-seed-layer, wherein, the modulating-layer comprises a metal layer or a metal nitride layer and preferred to be selected from the group consisting of Cu, CuN, CuCo, CuNi, NiN, the buffer-layer comprises at least one of the following elements Ni, Fe, Co, B, Cr, Ta, Hf, Nb, Zr, Mo, W, Ru or an alloy thereof or a multilayer of alloys thereof, the top-seed-layer comprises a metal layer selected from the group consisting of Pt, Pd, Ir;

forming a perpendicular magnetic pinning layer (pMPL) on the surface of said CSS and having a face-center-cubic (FCC) crystalline structure and having an invariable perpendicular magnetization direction;

forming an anti-ferromagnetic coupling spacer (AFC) provided on the surface of the pMPL;

forming a perpendicular magnetic reference layer (pMRL) provided on the surface of the AFC and having a body-center-cubic (BCC) crystalline structure and having an invariable magnetization direction;

forming a tunnel barrier (TB) layer on the surface of said pMRL;

forming a free layer (FL) on the surface of said TB and having a variable magnetization direction;

forming a capping layer (CL) on the surface of said FL;

annealing said film stack BE/base-layer/CSS/pMPL/AFC/pMRL/TB/FL/CL at a temperature between 350 and 450 degrees Celsius for 30 and 150 minutes.

* * * * *